United States Patent
Han et al.

(10) Patent No.: US 7,122,478 B2
(45) Date of Patent: Oct. 17, 2006

(54) METHOD OF MANUFACTURING A SEMICONDUCTOR DEVICE USING A POLYSILICON ETCHING MASK

(75) Inventors: Jeong-Nam Han, Seoul (KR); Woo-Gwan Shim, Yongin-si (KR); Woo-Sung Han, Seoul (KR); Chang-Ki Hong, Seongnam-si (KR); Sang Jun Choi, Seoul (KR)

(73) Assignee: Samsung Electronics Co., Ltd., (KR)

( * ) Notice: Subject to any disclaimer, the term of this patent is extended or adjusted under 35 U.S.C. 154(b) by 93 days.

(21) Appl. No.: 10/818,266

(22) Filed: Apr. 2, 2004

(65) Prior Publication Data

US 2005/0026420 A1   Feb. 3, 2005

(30) Foreign Application Priority Data

Jul. 31, 2003   (KR) .................. 10-2003-0053077

(51) Int. Cl.
   *H01L 21/302*   (2006.01)
   *H01L 21/461*   (2006.01)
(52) U.S. Cl. .................. 438/710; 438/719; 438/727
(58) Field of Classification Search ................ 438/710, 438/719, 727
   See application file for complete search history.

(56) References Cited

U.S. PATENT DOCUMENTS 6,235,214 B1 * 5/2001 Deshmukh et al. ........... 216/67
6,322,954 B1 * 11/2001 Li ............................... 430/313
6,719,808 B1 * 4/2004 Kim et al. .................... 438/710
2002/0149050 A1 * 10/2002 Fazio et al. ................. 257/314
2003/0040181 A1 * 2/2003 Suzuki ......................... 438/689

FOREIGN PATENT DOCUMENTS

KR   0061305   10/2000
KR   10-1999-0046909   * 5/2001

OTHER PUBLICATIONS

English Abstract* * *.

* cited by examiner

*Primary Examiner*—Carl Whitehead, Jr.
*Assistant Examiner*—Heather Doty
(74) *Attorney, Agent, or Firm*—F.Chau & Associates LLC (57) ABSTRACT

A method of manufacturing a semiconductor device using a polysilicon layer as an etching mask includes: (a) forming an interlayer dielectric over a semiconductor substrate; (b) forming a polysilicon layer pattern over the interlayer dielectric; (c) forming a contact hole in the interlayer dielectric by etching the interlayer dielectric using the polysilicon layer pattern as an etching mask; (d) removing the polysilicon layer pattern by an etching process that has a large etching selectivity of the polisilicon layer with respect to the interlayer dielectric and about 3% or less etching uniformity; and (e) forming a contact by filling the contact hole with a conductive material.

4 Claims, 9 Drawing Sheets

- ETCHING RATE OF POLYSILICON LAYER PATTERN (FLOW OF $CF_4$/FLOW OF $O_2$)
- ETCHING SELECTIVITY WITH RESPECT TO SILICON OXIDE FILM
- ETCHING SELECTIVITY WITH RESPECT TO SILICON NITRIDE FILM

METHOD OF MANUFACTURING A SEMICONDUCTOR DEVICE USING A POLYSILICON ETCHING MASK

BACKGROUND

1. Technical Field

The present disclosure relates to a method of manufacturing a semiconductor device, and more particularly, to a method of manufacturing a semiconductor device using a polysilicon layer pattern as an etching mask.

2. Discussion of Related Art

A photoresist pattern is widely used as an etching mask in a pattern forming process because it simplifies the process and produces a pattern of desired shape and size. However, as design rules decrease to 100 nm or less, many problems emerge in semiconductor device manufacturing processes in which a photoresist pattern is used as an etching mask. For example, striation may occur in a material layer that remains after etching. Moreover, the etched material layer may be formed to an undesired pattern because there is a small margin for error in etching processes.

Figure 1:
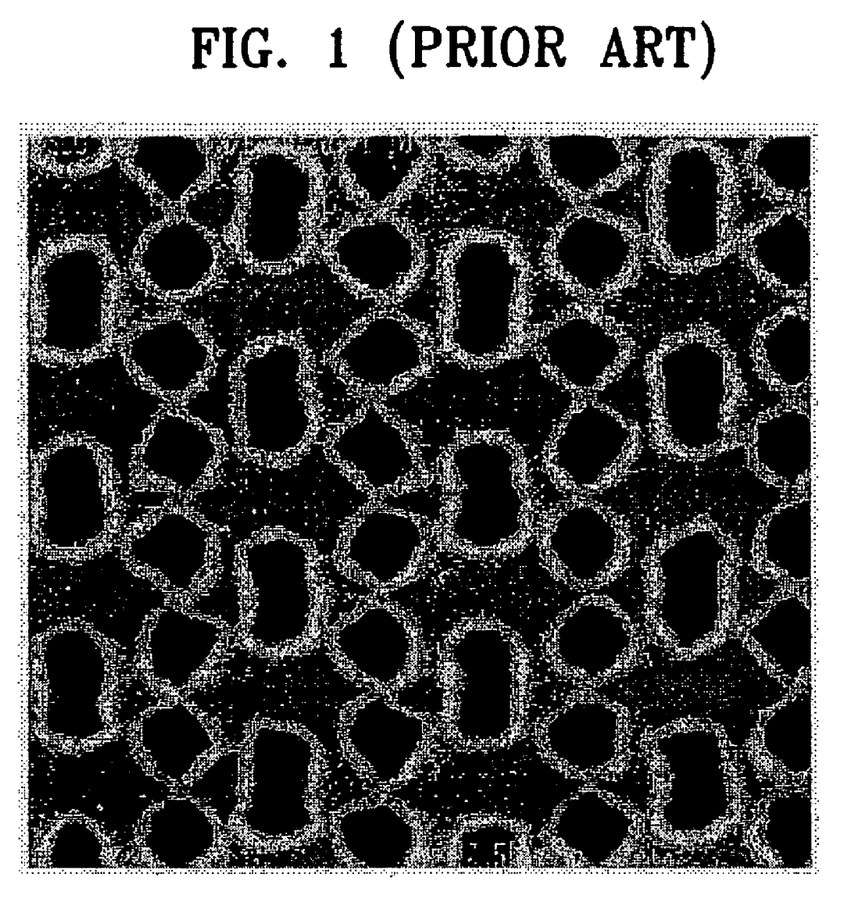
FIG. 1 is a low vacuum scanning electron microscopy (SEM) picture of a semiconductor device on which a contact is formed by a self-aligned contact (SAC) method using a photoresist layer pattern as an etching mask with a 96 nm design rule.

FIG. 1 illustrates a scanning electron microscopy (SEM) photograph of a semiconductor device on which a contact is formed by a self-aligned contact (SAC) method using a photoresist layer pattern as an etching mask with a 96 nm design rule. Referring to FIG. 1, many of the contacts have shapes that are different from the desired pattern shape, and furthermore, the pattern shape varies according to location on the semiconductor substrate.

To solve the above problems, a method of using a silicon nitride layer pattern or a polysilicon layer pattern as the etching mask has been developed. The occurrence of striation is prevented when a silicon nitride layer pattern or a polysilicon layer pattern is used as an etching mask (among the two layer patterns, the polysilicon layer is more preferable since it is deposited more easily than the silicon nitride layer). In addition, if an interlayer dielectric is etched with a dry etching method using a polysilicon layer pattern as the etching mask, the margin of error of the manufacturing process is greater than when the photoresist layer pattern is used as the etching mask.

FIGS. 2A through 2E are cross-sections illustrating a conventional method of forming a contact by a self-aligned contact (SAC) process using a polysilicon layer pattern as an etching mask.

Figure 2A:
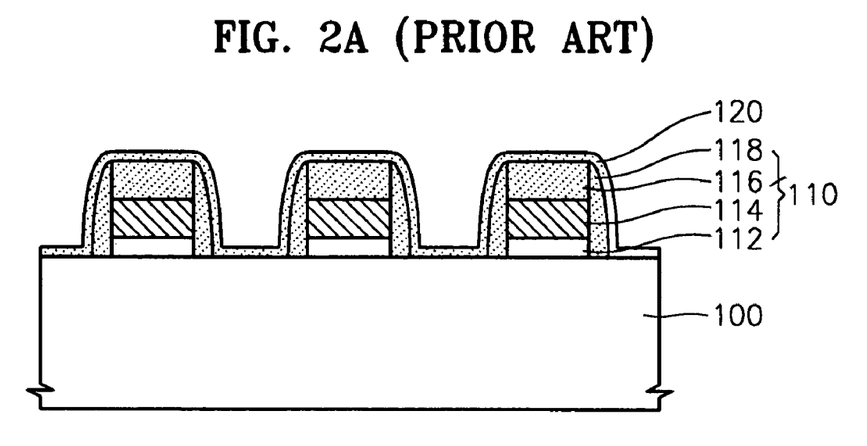
FIGS. 2A through 2E are cross-sections illustrating a conventional method of forming a contact by a self-aligned contact (SAC) process using a polysilicon layer pattern as an etching mask.

Referring to FIG. 2A, a gate structure 110 is formed on a semiconductor substrate 100 using conventional manufacturing technology. The gate structure 110 includes a gate oxide layer 112, a gate conductive layer 114, a hard mask layer 116, and a sidewall spacer 118. Also, an etch stop layer 120 is formed on the semiconductor substrate 100 and the gate structure 110. Preferably, the etch stop layer 120 is formed of a material having a large etching selectivity with respect to an interlayer dielectric that will be formed on the etch stop layer 120. For instance, if the interlayer dielectric is a silicon oxide layer, the etch stop layer 120 may be formed of a silicon nitride layer.

Figure 2B:
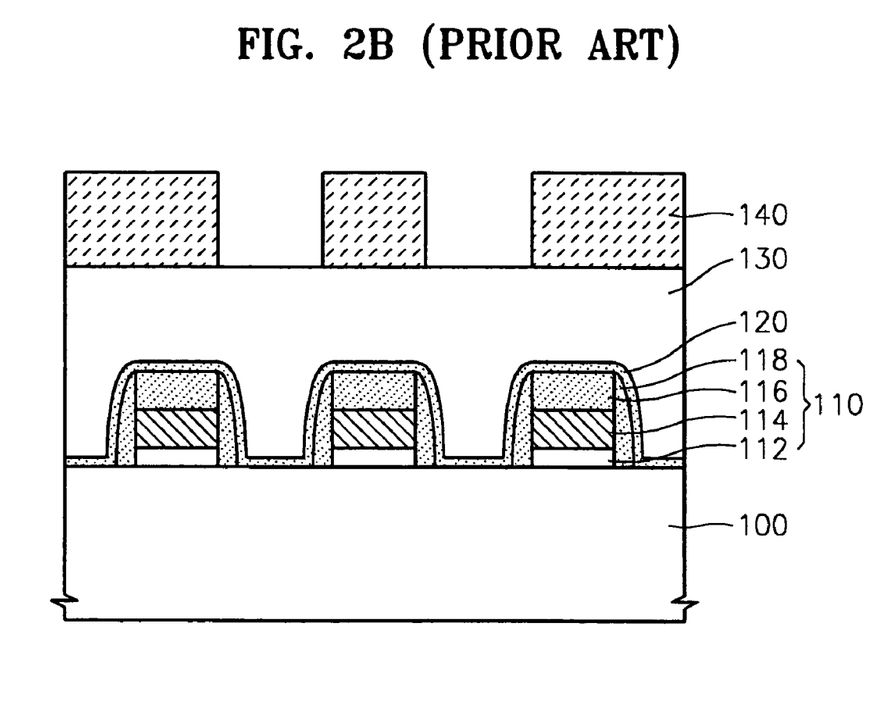

Referring to FIG. 2B, the interlayer dielectric 130 is formed on the etch stop layer 120. Preferably, the interlayer dielectric 130 is formed of a silicon oxide material. A polysilicon layer pattern 140, which will be used as a hardmask, is formed on the interlayer dielectric 130.

Figure 2C:
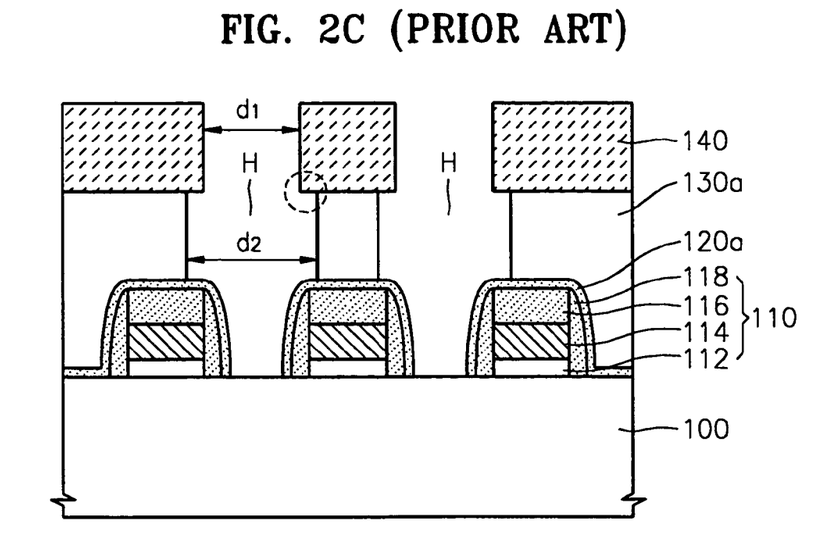

Referring to FIG. 2C, the interlayer dielectric 130 is etched using the polysilicon layer pattern 140 as the etching mask to leave behind an interlayer dielectric pattern 130a. A material having a large etching selectivity with respect to the hard mask layer 116 and the sidewall spacer 118 is used as an etching gas or liquid when etching the interlayer dielectric 130. The section of the etch stop layer 120 exposed by the polysilicon layer pattern 140 and not in contact with the gate structure 110 is also etched. As a consequence, an etch stop layer pattern 120a remains on the gate structure 110 and a contact hole H that exposes the semiconductor substrate 100, is formed.

Next, a cleaning process to remove impurities including etching residues is performed. However, the interlayer dielectric pattern 130a is etched more than the polysilicon layer pattern 140 in the cleaning process such that the distance $d_1$ between adjacent sections of the polysilicon layer 140 is less than the distance $d_2$ between adjacent sections of the interlayer dielectric pattern 130a. This etching rate difference is inevitable when removing a native oxide layer or by-products that occur when etching. Consequently, as displayed in a dotted circle in FIG. 2C, the interlayer dielectric pattern 130a is etched more deeply than the polysilicon layer pattern 140a.

Figure 2D:
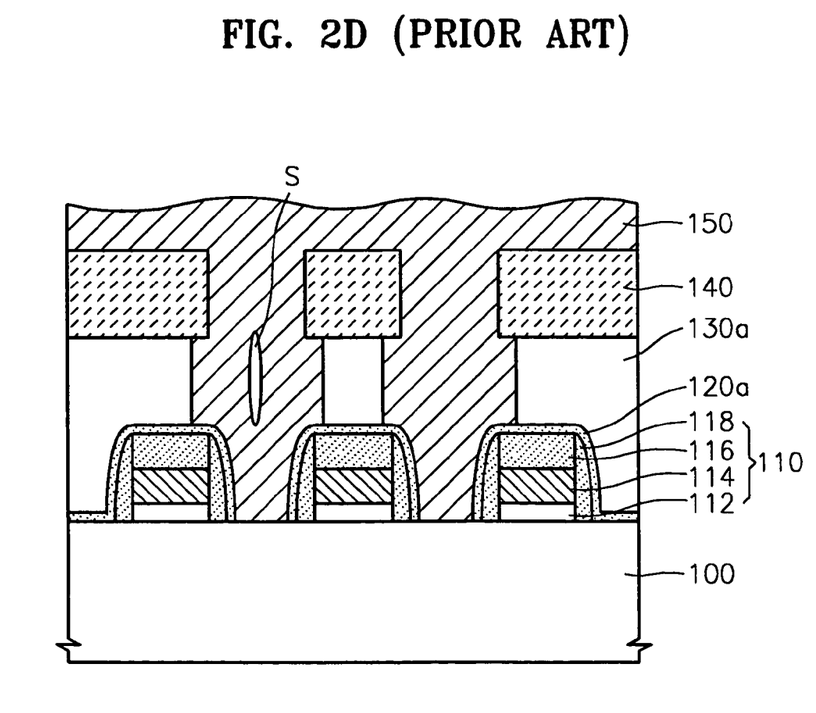

The contact hole H is then filled with a conductive material such as doped polysilicon 150, resulting in the structure illustrated in FIG. 2D. Referring to FIG. 2D, a void or seam S may form in the doped polysilicon 150 filling the contact hole H. The void or seam S forms because the interlayer dielectric pattern 130a has a high etch selectivity with respect to the polysilicon layer pattern 140, causing the width of the interlayer dielectric pattern $d_2$ to be larger than the width of the polysilicon layer pattern $d_1$.

Figure 2E:
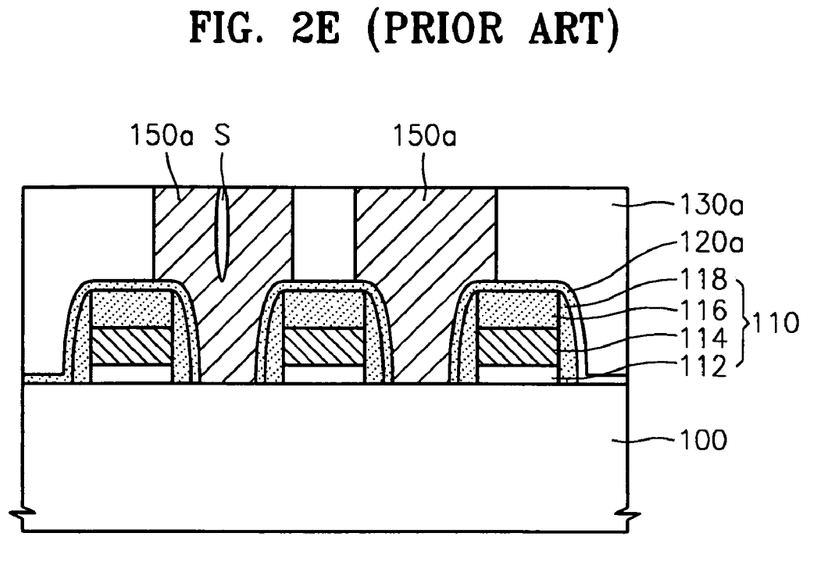

Referring to FIG. 2E, the polysilicon layer pattern 140 is removed until the interlayer dielectric pattern 130a is exposed, and the doped polysilicon 150 is etched at the same time. In this case, a dry etchback or a chemical mechanical polishing (CMP) process is utilized. As a result, a contact 150a including the void or seam S is formed in the interlayer dielectric pattern 130a.

If the seam S exists in the contact 150a, contact resistance increases since the area of contact 150a is reduced. If by-products of etching or other impurities remain, the resistance further increases and the reliability of the semiconductor device may decrease.

An oxide buffing CMP process may be conducted to solve these problems. However, the oxide buffing CMP process cannot completely remove the seam S in the contact 150a and is expensive to implement.

Furthermore, when using the polysilicon layer pattern 140 as the etching mask, a process of removing the polysilicon layer pattern 140 is conducted only after filling the contact hole H. Accordingly, if the contact hole H is formed as shown in FIG. 2C, it cannot be determined whether the contact hole H is fully open when a substrate is in an in-line state using, for example, an SEM imaging process, because the polysilicon layer pattern 140 remains on the interlayer dielectric pattern 130a. Thus, destructive testing must be used.

Accordingly, there is a need for a method of manufacturing a semiconductor device using a polysilicon etching mask in which in-line testing can be used to determine whether a contact hole is fully open or not, and which prevents occurrence of seams inside a contact and reduces manufacturing costs.

SUMMARY OF THE INVENTION

A method of manufacturing a semiconductor device using a polysilicon etching mask according to an embodiment of the invention includes: (a) forming an interlayer dielectric over a semiconductor substrate; (b) forming a polysilicon layer pattern over the interlayer dielectric; (c) forming a contact hole in the interlayer dielectric by etching the interlayer dielectric using the polysilicon layer pattern as an etching mask; (d) removing the polysilicon layer pattern by an etching process that has a large etching selectivity of the polysilicon with respect to the interlayer dielectric and 3% or less etching uniformity; and (e) forming a contact by filling the contact hole with a conductive material.

In at least one embodiment of the invention, an etch stop layer is formed over the semiconductor substrate and the conductive line before step (a). The etch stop layer exposed by the contact hole is etched after step (d). The etching of the polysilicon layer pattern is performed with a large etching selectivity of the polysilicon layer pattern with respect to the etch stop layer. The etching selectivity of the polysilicon layer pattern with respect to the interlayer dielectric is greater than about 50:1 and with respect to the etch stop layer is greater than about 25:1.

In at least one embodiment of the invention, the polysilicon layer pattern is removed by a chemical dry etching (CDE) method using a remote plasma, and the interlayer dielectric is a silicon oxide layer and the etch stop layer is a silicon nitride layer. The CDE method is conducted using an etchant including $CF_4$ and $O_2$ gas. Moreover, a flow ratio of $CF_4$:$O_2$ gas is about 150 sccm:60 sccm, and the remote plasma is preferably generated by microwave power of about 550 W or more.

Preferably, the interlayer dielectric is a silicon oxide layer and the etch stop layer is a silicon nitride layer, and the polysilicon layer pattern is removed by a wet etching method using diluted ammonia.

A method of manufacturing a semiconductor device using a polysilicon etching mask according to another embodiment of the invention includes: (a) forming a conductive line including a conductor pattern, a hard mask layer, and a sidewall spacer over a semiconductor substrate; (b) forming an interlayer dielectric over the conductive line; (c) forming a polysilicon layer pattern over the interlayer dielectric; (d) forming a contact hole in the interlayer dielectric by etching the interlayer dielectric using the polysilicon layer pattern as an etching mask; (e) removing the polysilicon layer pattern by an etching process that has a large etching selectivity of the polysilicon layer pattern with respect to the interlayer dielectric and about 3% or less etching uniformity; and (f) forming a contact by filling the contact hole with a conductive material.

The conductive line may be a gate line or a bit-line.

In at least on embodiment of the invention, the polysilicon layer pattern is removed before the contact hole is filled in with a conductive material.

BRIEF DESCRIPTION OF THE DRAWINGS

The present invention will become readily apparent by reference to the following detailed description when considered in conjunction with the accompanying drawings wherein.

DESCRIPTION OF PREFERRED EMBODIMENTS

The present invention will now be described more fully with reference to the attached drawings in which exemplary embodiments thereof are shown. This invention may, however, be embodied in many different forms and should not be construed as being limited to the embodiments set forth herein; rather these embodiments are provided so that this disclosure will be thorough and complete, and will fully convey the concepts of the invention to those skilled in the art. In the drawings, the forms of elements are exaggerated for clarity. To facilitate understanding, identical reference numerals have been used for like elements throughout the figures.

FIGS. 3A through 3D illustrate a method of forming a contact using a polysilicon layer pattern as an etching mask according to an embodiment of the invention.

Figure 3A:
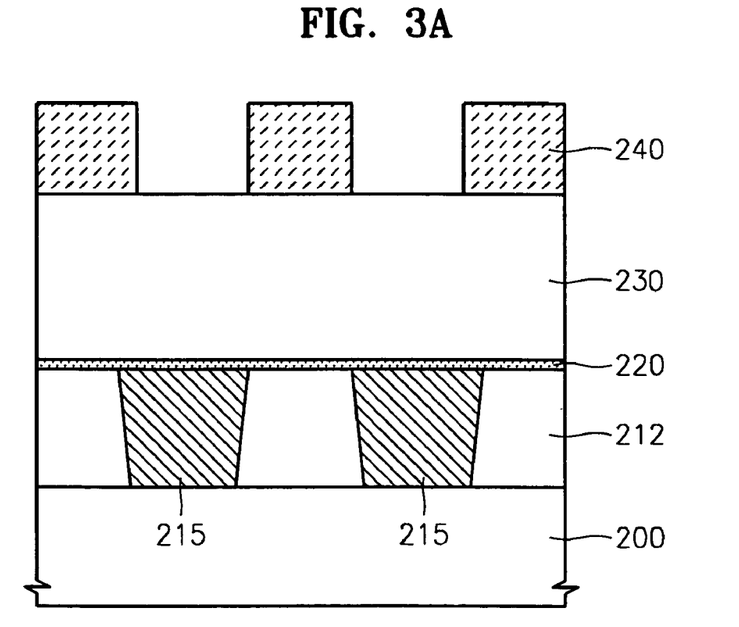
FIGS. 3A through 3D illustrate a method of forming a contact using a polysilicon layer pattern as an etching mask according to an embodiment of the present invention.

Referring to FIG. 3A, a first interlayer dielectric 212 including a contact pad 215 is formed on a substrate 200. The contact pad 215 may be formed of doped polysilicon or a metal.

An etch stop layer 220 is formed on the first interlayer dielectric 212. The etch stop layer 220 may be formed of silicon nitride. The process of forming the etch stop layer 220 is optional and the reason for this will be explained later. A second interlayer dielectric 230 is formed on the etch stop layer 220, and a polysilicon layer pattern 240 used as an etching mask is formed on the second interlayer dielectric 230. The polysilicon layer pattern 240 may be formed by patterning a polysilicon layer using photolithography technology.

Figure 3B:
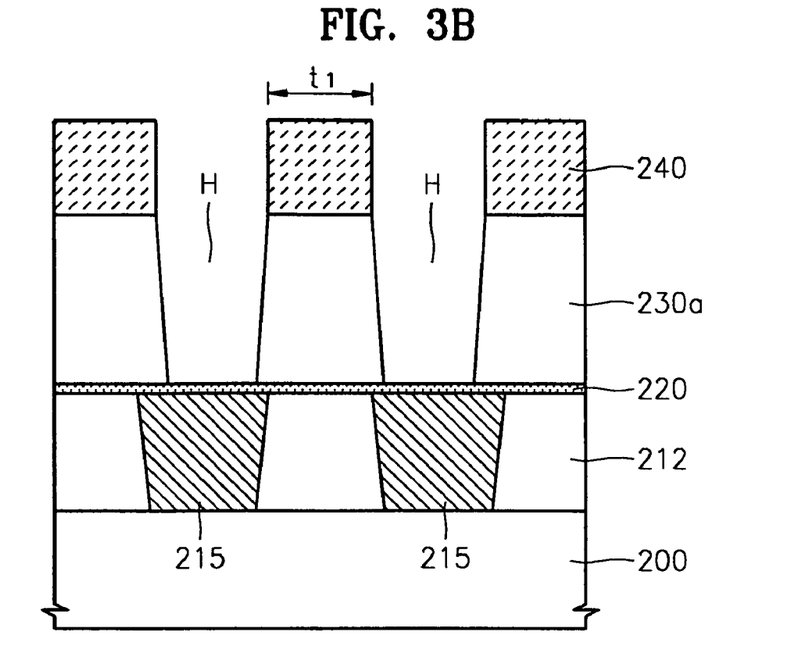

Referring to FIG. 3B, the second interlayer dielectric 230 is etched using the polysilicon layer pattern 240 as an etching mask. As a result, a second interlayer dielectric pattern 230a including a contact hole H is formed. The contact hole H exposes a contact pad 215. However, if the etch stop layer 220 exists, the contact hole exposes the etch stop layer 220.

Figure 3C:
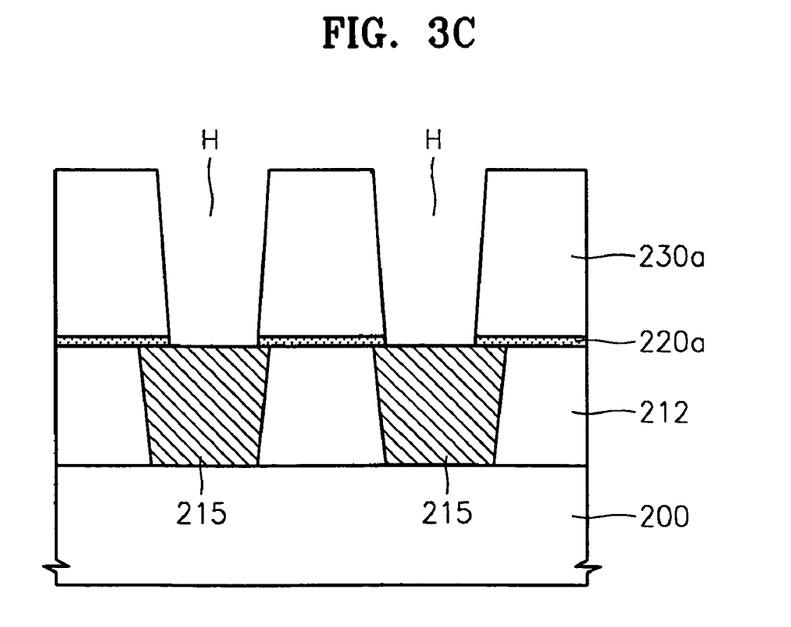

Referring to FIG. 3C, the polysilicon layer pattern 240 is removed. A process of removing the polysilicon layer patterns 240 and an etchant used in this process should be selected given the following conditions:

First, the dielectric formed below the polysilicon layer pattern 240, i.e., the second interlayer dielectric pattern 230a, should be negligibly etched when etching the polysilicon layer pattern 240. When a design rule is 100 nm or less, greater care should be taken not to etch the second interlayer dielectric pattern 230a because the width $t_1$ of the second interlayer dielectric pattern 230a is very small. That is, the polysilicon layer pattern 240 should have a higher etching selectivity than the second interlayer dielectric pattern 230a. The required etching selectivity depends on the thickness of the polysilicon layer pattern 240 that will be removed and the width $t_1$, of the second interlayer dielectric patterns 230a that remains between the contact holes H. The etching selectivity of the polysilicon layer pattern 240 with respect to the second interlayer dielectric pattern 230a is preferably greater than 30:1. However, when the width $t_1$, of the second interlayer dielectric patterns 230a is 100 nm or less due to reduction of the design rule, the etching selectivity of the polysilicon layer pattern 240 with respect to the second interlayer dielectric pattern 230a is preferably greater than 50:1.

Second, the contact pad 215 exposed by the contact hole H should remain intact. If a very large etching selectivity of the polysilicon layer pattern 240 with respect to the contact pad 215 is used in the etching process, a process of forming the etch stop layer 220 described in reference to FIG. 3A is not required. Therefore, if the contact pad 215 is formed of a silicon substrate or doped polysilicon, the process of forming the etch stop layer 220 is required. In this case, the etching selectivity of the polysilicon layer pattern 240 with respect to the etch stop layer 220 should be large. That is, after the polysilicon layer pattern 240 is etched, the etch stop layer 220 should remain to prevent any damage to the contact pad 215.

For example, if the polysilicon layer pattern 240 used as the etch mask is formed to be 1000 Å thick, a loss of about 300 Å in thickness occurs during formation of the contact holes H, and thus, the remaining polysilicon layer pattern is about 700 Å thick. In addition, if the silicon nitride layer used as the etch stop layer is formed to be 100 Å thick, a loss of about 70 Å in thickness occurs during formation of the contact holes H, and the remaining silicon nitride layer is about 30 Å thick. Therefore, the etching selectivity of the polysilicon layer with respect to the silicon nitride layer should be greater than 25:1 so that the polysilicon layer pattern is removed before the silicon nitride layer is completely etched away.

Third, the etching should be conducted equally over the whole surface of a wafer. If an etching rate differs greatly between the center and edge portions of the wafer, the yield is lowered because the etching process is difficult to control and defects may occur at certain locations on the wafer. Whether the etching is uniform is determined by $$\text{Etching Uniformity} = \frac{\text{MAX Etching Thickness} - \text{MIN Etching Thickness}}{2 \times \text{AVE Etching Thickness}} \times 100$$

For instance, if a poly-etchant, in which a ratio of $HNO_3$:$CH_3COOH$:HF:IW is 40:2:1:20 or a ratio of $HNO_3$:HF is 25:1, is used to remove the polysilicon layer pattern 240, the etching selectivity of the polysilicon layer pattern 240 with respect to the silicon oxide layer should be at least 40 or 45:1. However, in this case, the etching uniformity is greater than 3%, and thus it is not preferable to use the poly-etchant to remove the polysilicon layer pattern. The process of removing of the polysilicon layer pattern 240 according to an embodiment of the present invention should satisfy the above first and second conditions. It is preferable that the removing process also satisfies the third condition. For example, if the second interlayer dielectric 230 is a silicon oxide layer and the etch stop layer 220 is a silicon nitride layer, there are two types of removing processes that satisfy the above first and second conditions.

First, the polysilicon layer pattern 240 can be removed by a chemical dry etch (CDE) method using $CF_4$ or $O_2$ gas. In the CDE method, a chemical reaction occurs between reacting species of the etching gas and the material that is being removed. A remote plasma is generally used for this method. However, direct plasma is preferably not used in removing the polysilicon layer pattern 240 since the direct plasma can cause damage to the etch stop layer 220 and/or the contact pad 215.

Figure 5:
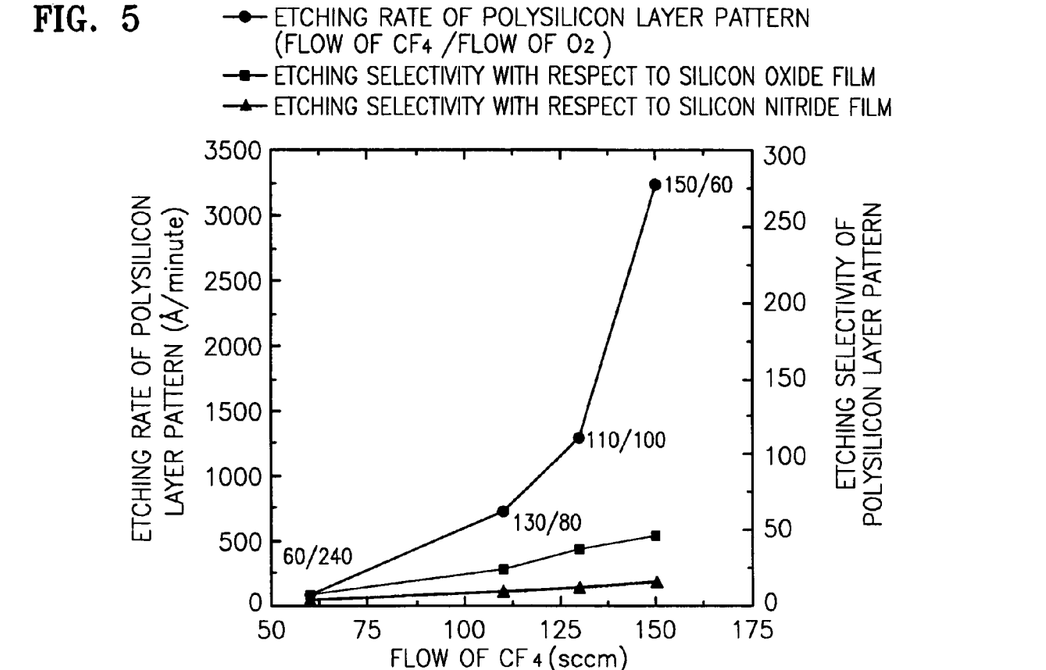
FIG. 5 is a graph illustrating an etching rate of a polysilicon layer and an etching selectivity of a polysilicon layer to a silicon oxide layer and a silicon nitride layer with respect to a flow rate of $CF_4$ gas in a CDE process.

FIG. 5 is a graph illustrating etching rate of the polysilicon layer pattern and etching selectivity of the polysilicon layer pattern to a silicon oxide layer and a silicon nitride layer with respect to flow rate of $CF_4$ gas in a CDE process. The graph shows results of tests conducted at room temperature, a microwave power of 400 W, and a pressure of 30 Pa.

Referring to FIG. 5, the etching rate of the polysilicon layer pattern increases exponentially as the flow rate of the $CF_4$ gas increases. For example, if a flow ratio of $CF_4$ gas/$O_2$ gas is 130 sccm/80 sccm, the etching rate of the polysilicon layer pattern is about 1500 Å/minute. However, if the flow ratio of $CF_4$ gas/$O_2$ gas is 150 sccm/60 sccm, the etching rate of the polysilicon layer pattern is about 3000 Å/minute. Moreover, the etching selectivities of the polysilicon layer pattern to the silicon oxide layer and the silicon nitride layer linearly increase as the flow rate of the $CF_4$ gas increases. If the flow ratio of $CF_4$/$O_2$ gas is 150 sccm/60 sccm, the etching selectivity of the polysilicon layer pattern to the silicon nitride layer is less than 25:1, and the etching selectivity of the polysilicon layer pattern to the silicon oxide layer is greater than 50:1.

Figure 6:
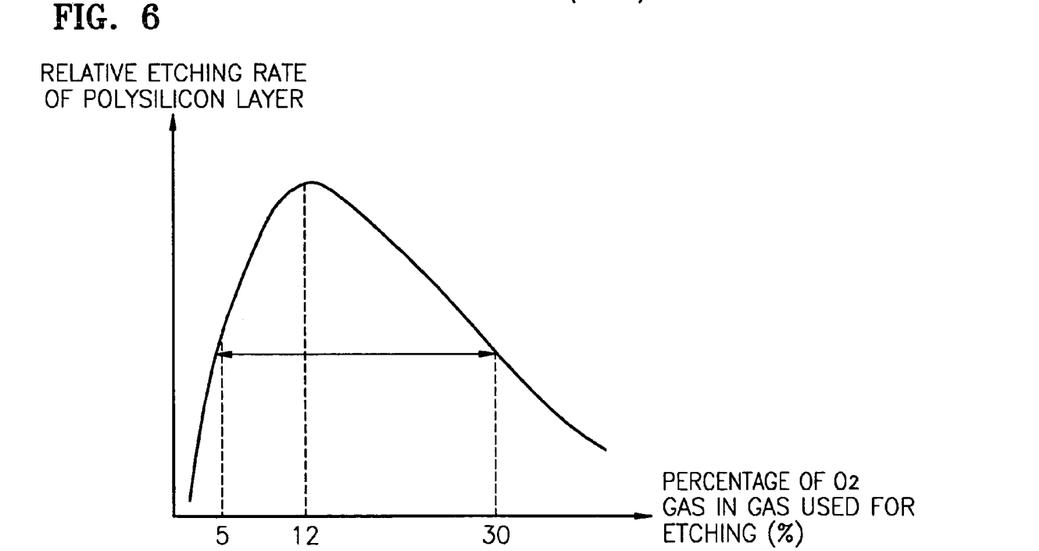
FIG. 6 is a graph illustrating a relative etching rate of a polysilicon layer with respect to the percentage of $O_2$ in a gas used for etching.

FIG. 6 is a graph illustrating a relative etching rate of a polysilicon layer with respect to the percentage of $O_2$ in gas used for etching. Referring to FIG. 6, the etching rate of the polysilicon layer is greater when the percentage of $O_2$ in the gas used for etching is between 5% and 30%. Therefore, the etching selectivity of the polysilicon layer pattern to the silicon oxide layer and the silicon nitride layer is large enough to meet the required conditions.

Figure 7:
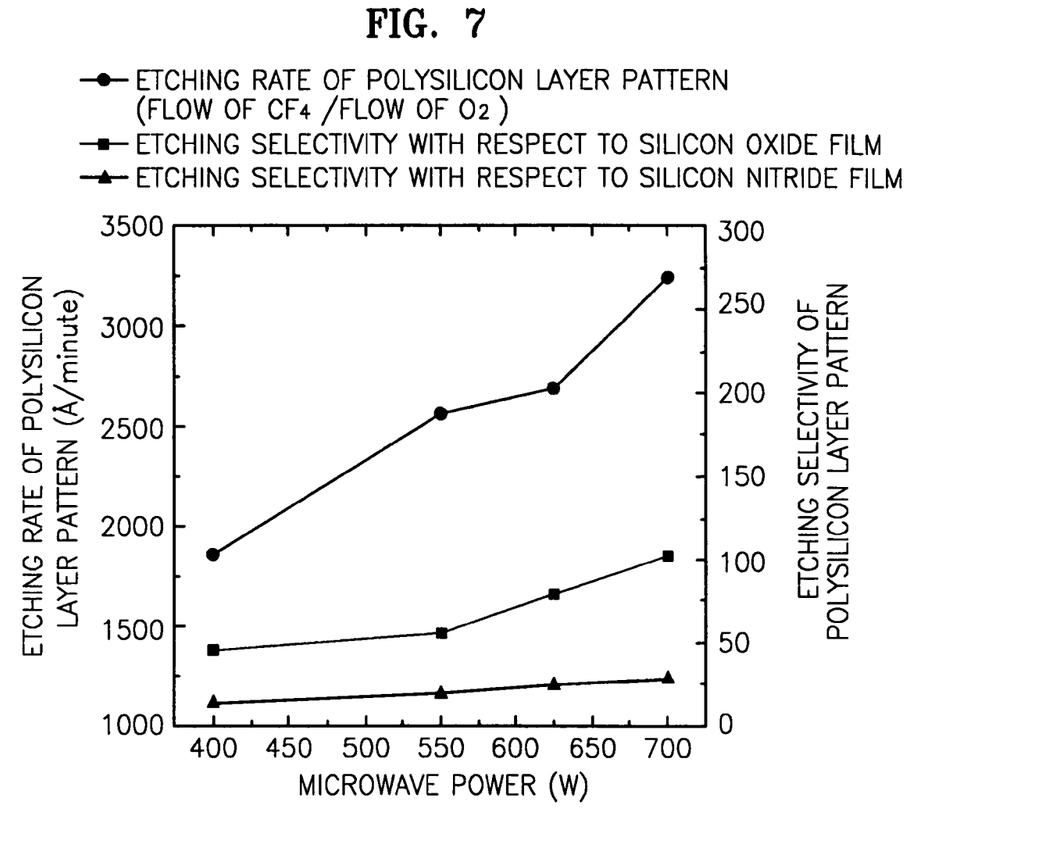
FIG. 7 is a graph illustrating an etching rate of a polysilicon layer and an etching selectivity of a polysilicon layer to a silicon oxide layer and silicon nitride layer with respect to microwave power in a CDE process.

FIG. 7 is a graph illustrating etching rate of the polysilicon layer pattern and etching selectivity of the polysilicon layer pattern to a silicon oxide layer and a silicon nitride layer with respect to microwave power in a CDE process. The graph shows results of tests conducted at room temperature and, a pressure of 30 Pa, with a flow ratio of $CF_4$/$O_2$ gas at 150 sccm/60 sccm.

Referring to FIG. 7, as the microwave power increases, the etching rate of the polysilicon layer pattern and the etching selectivity of the polysilicon layer pattern to the silicon oxide layer and the silicon nitride layer linearly increase with different slopes. The etching selectivity of the polysilicon layer pattern to the silicon oxide layer is greater than 50:1 and the etching selectivity of the polysilicon layer pattern to the silicon nitride layer is greater than 25:1, and the microwave power is greater than 550 W.

A second method in which the etching selectivity of the polysilicon layer pattern with respect to the silicon oxide layer and the silicon nitride layer is large enough is a wet etching method using diluted ammonia. If diluted ammonia is used, the etching selectivity of the polysilicon layer pattern to the silicon oxide layer is about 30:1, and the silicon nitride layer is hardly etched. In addition, the etching uniformity is less than 3%. Accordingly, this method can be used to remove the polysilicon layer pattern 230 when the width of the second interlayer dielectric pattern 230*a* between the contact holes H is relatively large.

Referring to FIG. 3C, the etch stop layer 220 exposed by the contact holes H is etched after removing the polysilicon layer patterns 240. An etch stop layer pattern 220*a* remains under the second interlayer dielectric pattern 230*a* and a section of the upper surface of the contact pad 215 is exposed.

Figure 3D:
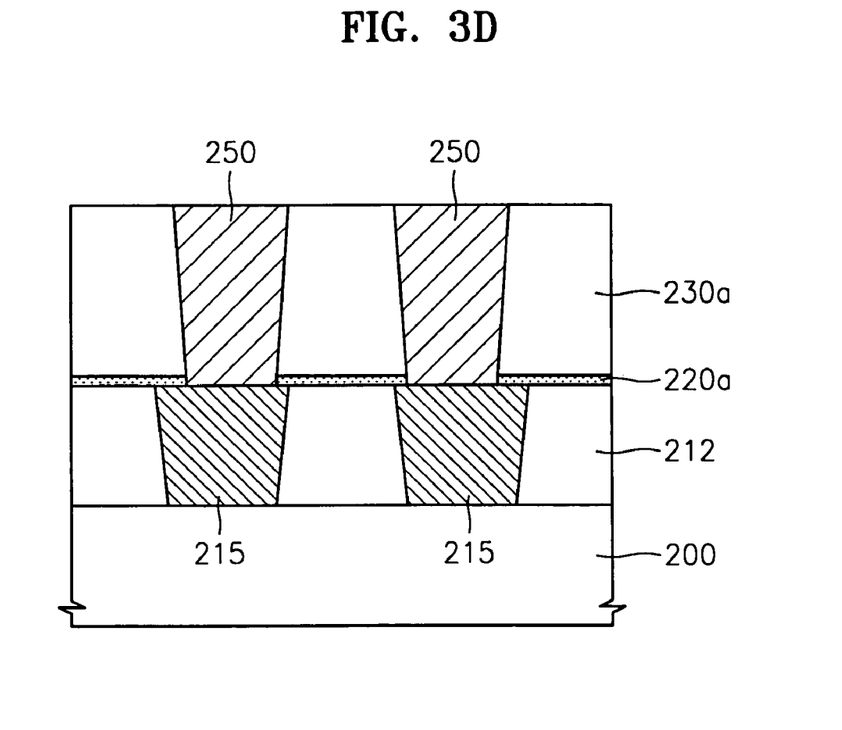

Referring to FIG. 3D, a conductive material, for instance a doped polysilicon or a metal, is used to fill the contact holes H to form a contact 250. The contact 250 is etched using a dry etchback or CMP method until the second interlayer dielectric patterns 230*a* and the contact 250 have a common planar upper surface.

The method according to various exemplary embodiments of the invention has many applications, such as in the formation of a contact plug for a storage node and contact pad in DRAM, a metal contact for an upper electrode of a capacitor and a metal wiring line, or a contact in a core/periphery area.

Figure 4A:
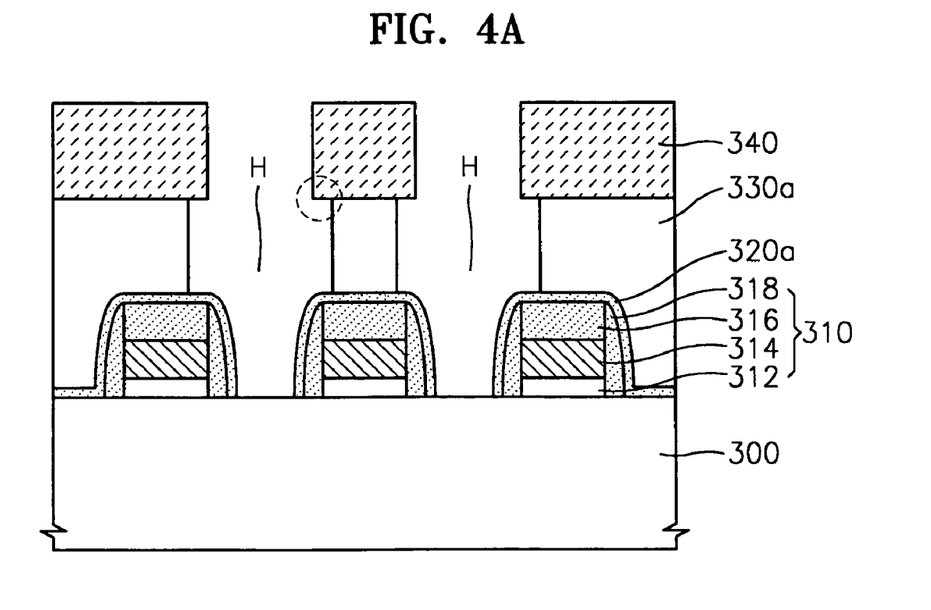
FIGS. 4A through 4C illustrate a method of forming a contact by a self-aligned contact (SAC) method using a polysilicon layer pattern as an etching mask according to another embodiment of the present invention.
Figure 4B:
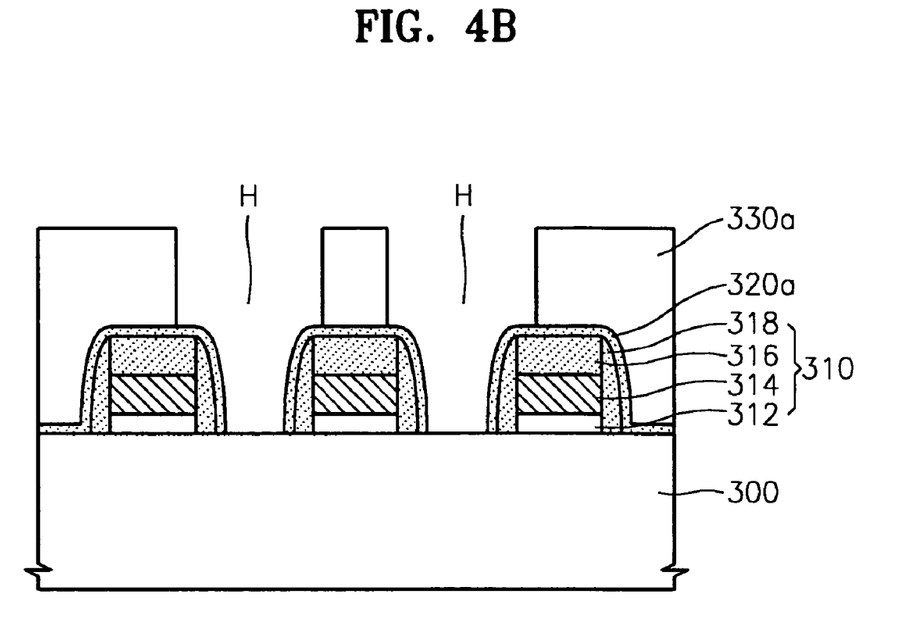
Figure 4C:
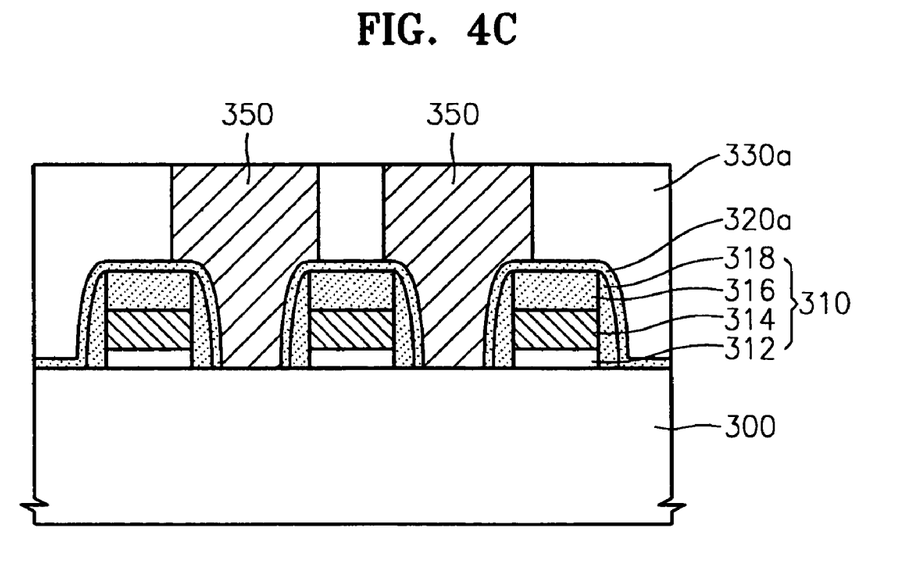

FIGS. 4A through 4C illustrate a method of forming a contact by a self-aligned contact (SAC) method using a polysilicon layer pattern as an etching mask according to another embodiment of the present invention.

According to the present embodiment of the invention, a polysilicon layer pattern 340 is used as an etching mask and a contact hole H is formed by the SAC method. That is, processes described with reference to FIGS. 1, 2A, 2B, and 2C can be applied to to form the contact hole H. Referring to FIG. 4A, a first interlayer dielectric pattern 330*a* including the contact hole H is formed on a semiconductor substrate 300. A gate structure 310 including a gate oxide layer 312, a gate conductive layer 314, a hard mask layer 316, and a sidewall spacer 318 is formed below the first interlayer dielectric pattern 330*a* and an etch stop layer pattern 320*a* is formed on the gate structure 310. In addition, the polysilicon layer pattern 340 is formed on the first interlayer dielectric pattern 330*a*. As described above, the first interlayer dielectric pattern 330*a* is etched more than the polysilicon layer pattern 340 in a forming and cleaning process of the contact hole H, and thus, as highlighted by a dotted circle in FIG. 4A, the width of the first interlayer dielectric pattern 330*a* is narrower that that of the polysilicon layer pattern 340.

Referring to FIG. 4B, the polysilicon layer pattern 340 is removed using the above-described CDE method using $CF_4$ and $O_2$ gas as the etching gas or wet etching method using diluted ammonia as an etching liquid. After removing the polysilicon layer pattern 340, the etch stop layer 320 exposed by the contact hole H is removed.

For example, the polysilicon layer pattern 340 used as the etching mask may be formed to a thickness of 1000 Å. The polysilicon layer pattern 340 loses about 250 Å or 350 Å in thickness during etching of the first interlayer dielectric 330 to form the contact holes H. As a result, the remaining polysilicon layer pattern 340 is about 650 Å or 750 Å thick. In addition, the etch stop layer 320 having a thickness of about 100 Å is etched during etching of the first interlayer dielectric 330 and thus loses about 70 Å in thickness. The remaining etch stop layer is about 30 Å or 40 Å thick.

Therefore, the etching selectivity of the polysilicon layer to the etch stop layer should be 20 or more, preferably 25, in order to remove the polysilicon layer pattern 340 before the etch stop layer pattern 320*a* is completely worn away. As described above, referring to FIGS. 5 and 6, in a case where the CDE method is used, the flow ratio of the $CF_4$ gas/$O_2$ gas is 150 sccm/60 sccm or more. The microwave power used in generating the remote plasma is preferably 550 W or more. Furthermore, the etching uniformity is 3% or less.

Referring to FIG. 4C, a contact 350 is formed in the contact hole H by filling the contact hole H conductive material, and then etching the conductive material.

In exemplary embodiments of the present invention, a polysilicon layer pattern is used as an etching mask, and thus striation does not occur and an etching profile of a desired shape is obtained. In addition, the margin of error of the manufacturing process is increased, and thus the overall process is simplified in comparison to a process in which a silicon nitride layer is used as an etching mask.

Moreover, the polysilicon layer pattern used as an etching mask has a large etching selectivity with respect to a silicon oxide layer or a silicon nitride layer. Therefore, it is possible to prevent damage to the semiconductor substrate or the conductor exposed by the contact hole and an electrical short from occurring between contacts due to excessive etching of the interlayer dielectric between the contact holes. Also, the yield is enhanced due to the uniform etching over the entire surface of the wafer. Particularly, the CDE method using the remote plasma or the wet etching method utilizing the diluted ammonia reduces manufacturing costs and prevents degradation of semiconductor device characteristics due to seams occurring in the conductive material filling the contact holes.

Furthermore, the contact hole is filled with the conductive material after removing the polysilicon layer pattern, and thus the in-line test to determine whether the contact hole is completely open can be conducted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
   (a) forming an interlayer dielectric over a semiconductor substrate;
   (b) forming a polysilicon layer pattern over the interlayer dielectric;
   (c) forming a contact hole in the interlayer dielectric by etching the interlayer dielectric using the polysilicon layer pattern as an etching mask;
   (d) removing the polysilicon layer pattern by an etching process that has a large etching selectivity of the polysilicon layer with respect to the interlayer dielectric and about 3% or less etching uniformity; and
   (e) forming a contact by filling the contact hole with a conductive material, forming an etch stop layer on the semiconductor substrate before step (a), and etching the etch stop layer exposed by the contact hole after step (d), wherein the etching of the polysilicon layer pattern is performed with a large etching selectivity of the polysilicon layer pattern with respect to the etch stop layer, wherein the etching selectivity of the polysilicon layer pattern with respect to the interlayer dielectric is greater than about 50:1 and with respect to the etch stop layer is greater than about 25:1, wherein the polysilicon layer pattern is removed by a chemical dry etching (CDE) method using a remote plasma, wherein the interlayer dielectric is a silicon oxide layer and the etch stop layer is a silicon nitride layer, and the CDE method is conducted using an etchant comprising a $CF_4$ and $O_2$ gas, and wherein a flow ratio of $CF_4:O_2$ gas is about 150 sccm:60 sccm.

2. The method of claim 1, wherein the remote plasma is generated by microwave power and the power is about 550 W or more.

3. A method of manufacturing a semiconductor device using a polysilicon etching mask, the method comprising:
 (a) forming a conductive line including a conductor pattern, a hardmask layer, and a sidewall spacer over a semiconductor substrate;
 (b) forming an interlayer dielectric over the conductive line;
 (c) forming a polysilicon layer pattern over the interlayer dielectric;
 (d) forming a contact hole in the interlayer dielectric by etching the interlayer dielectric using the polysilicon layer pattern as an etching mask;
 (e) removing the polysilicon layer pattern by an etching process that has a large etching selectivity of the polysilicon layer pattern with respect to the interlayer dielectric and about 3% or less etching uniformity; and
 (f) forming a contact by filling the contact hole with a conductive material, forming an etch stop layer over the semiconductor substrate and the conductive line before step (b), and etching the etch stop layer exposed by the contact hole after step (e), wherein the etching of the polysilicon pattern is performed with a large etching selectivity of the polysilicon layer pattern with respect to the etch stop layer, wherein the etching selectivity of polysilicon layer pattern with respect to the interlayer dielectric is greater than about 50:1 and with respect to the etch stop layer is greater than about 25:1, wherein the polysilicon layer pattern is removed by a chemical dry etching (CDE) method using a remote plasma, wherein the interlayer dielectric is a silicon oxide layer and the etch stop layer is a silicon nitride layer, and the CDE method is conducted using an etchant having a $CF_4$ and $O_2$ gas, and wherein a flow ratio of $CF_4:O_2$ gas is 150 sccm:60 sccm.

4. A method of manufacturing a semiconductor device using a polysilicon etching mask, the method comprising:
 (a) forming a conductive line including a conductor pattern, a hardmask layer, and a sidewall spacer over a semiconductor substrate;
 (b) forming an interlayer dielectric over the conductive line;
 (c) forming a polysilicon layer pattern over the interlayer dielectric;
 (d) forming a contact hole in the interlayer dielectric by etching the interlayer dielectric using the polysilicon layer pattern as an etching mask;
 (e) removing the polysilicon layer pattern by an etching process that has a large etching electivity of the polysilicon layer pattern with respect to the interlayer dielectric and about 3% or less etching uniformity; and
 (f) forming a contact by filling the contact hole with a conductive material, forming an etch stop layer over the semiconductor substrate and the conductive line before step (b), and etching the etch stop layer exposed by the contact hole after step (e), wherein the etching of the polysilicon pattern is performed with a large etching selectivity of the polysilicon layer pattern with respect to the etch stop layer, wherein the etching selectivity of polysilicon layer pattern with respect to the interlayer dielectric is greater than about 50:1 and with respect to the etch stop layer is greater than about 25:1, wherein the polysilicon layer pattern is removed by a chemical dry etching (CDE) method using a remote plasma, wherein the interlayer dielectric is a silicon oxide layer and the etch stop layer is a silicon nitride layer, and the CDE method is conducted using an etchant having a $CF_4$ and $O_2$ as and wherein the remote plasma is generated by microwave power and the power is about 550 W or more.

* * * * *